(12) United States Patent
Jeong et al.

(10) Patent No.: US 8,642,367 B2
(45) Date of Patent: Feb. 4, 2014

(54) THIN FILM TRANSISTOR HAVING IMPROVED MANUFACTURABILITY AND METHOD FOR MANUFACTURING A DISPLAY PANEL CONTAINING SAME

(75) Inventors: Yu-Gwang Jeong, Yongin-si (KR); Young-Wook Lee, Suwon-si (KR); Sang-Gab Kim, Seoul (KR); Woo-Geun Lee, Yongin-si (KR); Min-Seok Oh, Yongin-si (KR); Jang-Soo Kim, Yongin-si (KR); Kap-Soo Yoon, Seoul (KR); Shin-Il Choi, Seoul (KR); Hong-Kee Chin, Suwon-si (KR); Seung-Ha Choi, Siheung-si (KR); Seung-Hwan Shim, Seongnam-si (KR); Sung-Hoon Yang, Seoul (KR); Ki-Hun Jeong, Cheongan-si (KR)

(73) Assignee: Samsung Display Co., Ltd. (KR)

( * ) Notice: Subject to any disclaimer, the term of this patent is extended or adjusted under 35 U.S.C. 154(b) by 98 days.

(21) Appl. No.: 13/042,348

(22) Filed: Mar. 7, 2011

(65) Prior Publication Data

US 2011/0159622 A1 Jun. 30, 2011

Related U.S. Application Data

(62) Division of application No. 12/331,361, filed on Dec. 9, 2008, now Pat. No. 7,923,732.

(30) Foreign Application Priority Data

Dec. 11, 2007 (KR) .................. 10-2007-0128464

(51) Int. Cl.
*H01L 21/02* (2006.01)
(52) U.S. Cl.
USPC .................. 438/34; 257/E33.013

(58) Field of Classification Search
USPC .................. 438/34; 257/E33.013
See application file for complete search history.

(56) References Cited

U.S. PATENT DOCUMENTS

| | | | |
|---|---|---|---|
| 6,285,041 B1 * | 9/2001 | Noguchi ................ | 257/61 |
| 6,429,456 B1 * | 8/2002 | Takechi et al. ......... | 257/59 |
| 7,102,168 B2 * | 9/2006 | Rhee et al. ............. | 257/72 |
| 2004/0127032 A1 * | 7/2004 | Peng et al. ............. | 438/689 |
| 2005/0024550 A1 * | 2/2005 | Kim ...................... | 349/43 |
| 2007/0138471 A1 | 6/2007 | Lim et al. | |

FOREIGN PATENT DOCUMENTS

| | | |
|---|---|---|
| JP | 6-069233 | 3/1994 |
| JP | 7-273347 | 10/1995 |
| JP | 11-337976 | 12/1999 |
| KR | 10-2004-0081281 | 9/2004 |
| KR | 10-2006-0004718 | 1/2006 |

* cited by examiner

*Primary Examiner* — Wensing Kuo
(74) *Attorney, Agent, or Firm* — Innovation Counsel LLP

(57) ABSTRACT

Embodiments of the present invention relate to a thin film transistor and a manufacturing method of a display panel, and include forming a gate line including a gate electrode on a substrate, forming a gate insulating layer on the gate electrode, forming an intrinsic semiconductor on the gate insulating layer, forming an extrinsic semiconductor on the intrinsic semiconductor, forming a data line including a source electrode and a drain electrode on the extrinsic semiconductor, and plasma-treating a portion of the extrinsic semiconductor between the source electrode and the drain electrode to form a protection member and ohmic contacts on respective sides of the protection member. Accordingly, the process for etching the extrinsic semiconductor and forming an inorganic insulating layer for protecting the intrinsic semiconductor may be omitted such that the manufacturing process of the display panel may be simplified, manufacturing cost may be reduced, and productivity may be improved.

15 Claims, 13 Drawing Sheets

THIN FILM TRANSISTOR HAVING IMPROVED MANUFACTURABILITY AND METHOD FOR MANUFACTURING A DISPLAY PANEL CONTAINING SAME

CROSS-REFERENCE TO RELATED APPLICATION

This is a divisional of U.S. patent application Ser. No. 12/331,361, filed Dec. 9, 2008, which application claims priority to and the benefit of Korean Patent Application No. 10-2007-0128464 filed in the Korean Intellectual Property Office on Dec. 11, 2007, the entire contents of which are incorporated herein by their references.

BACKGROUND (a) Technical Field

Embodiments of the present invention generally relate to a thin film transistor and a manufacturing method of a display panel.

(b) Related Art

A liquid crystal display (LCD), a plasma display panel (PDP), and an organic light emitting device (OLED) are among widely used flat panel displays.

The LCD is a display device using electro-optical characteristics of liquid crystals in which light transmission amounts are varied according to the intensity of an applied electric field to thereby realize the display of images. The PDP is a display device for displaying images by using plasma generated by gas discharge. In the OLED, electrons and holes are injected into an organic illumination layer, respectively, from a cathode (the electron injection electrode) and an anode (the hole injection electrode). The injected electrons and holes are combined to generate excitons, which illuminate when converting from an excited state to a ground state.

In addition, as a display device that is widely used, a field emission display (FED) utilizing the tunneling effect of quantum mechanics to emit electrons from electron emission sources formed on cathode electrodes may be provided. The emitted electrons strike a phosphor layer formed on an anode electrode to illuminate the phosphor layer and thereby result in the display of images. An electrophoretic display (EPD) is a display device utilizing the electrophoretic phenomenon to repeatedly write or erase information made of symbols such as characters and numbers.

Among the flat panel displays, an active matrix type in which each pixel is independently controlled by including switching elements such as a thin film transistor is generally used. The thin film transistor may be classified as a top gate type and a bottom gate type according to the position of a gate electrode. Amorphous silicon and polysilicon are generally used as a material of a semiconductor forming a channel of the thin film transistor, wherein the amorphous silicon is widely used in the bottom gate type and the polysilicon is widely used in the top gate type.

In the bottom gate type, a gate electrode is disposed under a semiconductor member, and a source electrode and a drain electrode contact respective sides of the semiconductor member. The channel of the thin film transistor is formed in the portion that is disposed between the source electrode and the drain electrode in the semiconductor and is covered by an insulating layer.

When the channel of the thin film transistor, which is made of the semiconductor layer, is formed without a protection layer, the electrical characteristics of the thin film transistor are deteriorated by moisture or impurities incorporated from an atmosphere.

Particularly, in a COA (color filter on array) structure in which a color filter is formed on the same substrate as the thin film transistor, the organic layer of the color filter directly contacts the channel layer such that the channel layer is contaminated, and outgassing is generated from the organic layer of the color filter through a heat treatment of a following process such that a problem such as an image sticking is generated. Accordingly, an insulating layer is formed to prevent these problems, but the manufacturing process is complicated.

SUMMARY

One or more exemplary embodiments of the present invention simplify a manufacturing process of a thin film transistor and a display panel by omitting an etching step for an ohmic contact member and a process for additionally forming an insulating layer for protecting the channel layer.

A manufacturing method of a display panel according to an exemplary embodiment of the present invention includes forming a gate line including a gate electrode on a substrate, forming a gate insulating layer on the gate electrode, forming an intrinsic semiconductor on the gate insulating layer, forming an extrinsic semiconductor on the intrinsic semiconductor, forming a data line including a source electrode and a drain electrode on the extrinsic semiconductor, and plasma-treating a portion of the extrinsic semiconductor between the source electrode and the drain electrode to form a protection member and ohmic contacts divided on both sides of the protection member.

The manufacturing method may further include forming an organic layer on the protection member. The organic layer may contact the protection member.

The manufacturing method may further include forming a pixel electrode connected to the drain electrode on the organic layer.

The intrinsic semiconductor may comprise polysilicon and the extrinsic semiconductor may comprise polysilicon.

The forming of the extrinsic semiconductor may comprise plasma-treatment of the surface of the intrinsic semiconductor under phosphine.

The manufacturing method may further comprise cleaning the intrinsic semiconductor after forming the intrinsic semiconductor before forming the extrinsic conductor.

The cleaning of the intrinsic semiconductor may use hydrogen fluoride.

The thickness of the extrinsic semiconductor may be in a range from about 10 Å to about 100 Å.

The protecting member may comprise a portion of the same conductive impurity as the ohmic contacts.

A manufacturing method of a display panel according to another exemplary embodiment of the present invention includes forming a gate electrode on a substrate; forming a gate insulating layer on the gate electrode; sequentially depositing a first material layer, a second material layer, and a third material layer on the gate insulating layer; etching the third material layer, the second material layer, and the first material layer to form a data conductor, an extrinsic semiconductor, and an intrinsic semiconductor; etching the data conductor to form a source electrode and a drain electrode and simultaneously exposing a first portion of the extrinsic semiconductor; plasma-treating the first portion of the extrinsic semiconductor to form a protection member and to simultaneously form ohmic contacts divided on both sides with the respective protection member; forming a color filter on the source electrode, the drain electrode, and the protection member; and forming a pixel electrode connected to the drain electrode on the color filter.

The manufacturing method may further include forming a capping layer of an inorganic insulator on the color filter.

The plasma treatment may be executed by using a plasma generation apparatus including oxygen injected into a chamber. Argon (Ar) gas or helium (He) may be additionally injected into the chamber.

The sequential etching of the third material layer, the second material layer, and the first material layer, the etching of the data conductor, and the plasma treatment of the extrinsic semiconductor may be sequentially executed in the same plasma generation apparatus.

The forming of the source electrode and the drain electrode may include forming a photosensitive member on the third material layer, and removing the exposed portion of the data conductor by using the photosensitive member as a mask. The plasma-treating of the first portion of the extrinsic semiconductor may be executed under a condition in which the photosensitive member remains on the source electrode and the drain electrode.

A thin film transistor according to an exemplary embodiment of the present invention includes a gate electrode, a semiconductor on the gate electrode, a source electrode on the semiconductor, a drain electrode disposed at a distance from the source electrode, ohmic contacts including a first portion disposed between the semiconductor and the source electrode and a second portion disposed between the semiconductor and the drain electrode, a protection member connected between the first portion and the second portion of the ohmic contacts, the protection member comprising a portion of same conductive impurity as the ohmic contacts.

The protection member may comprise an insulator. The insulator may be a silicon oxide. The protecting member may be corresponding to the gate electrode. The protection member may be expanded in a depth direction to the gate electrode consuming a portion of the top surface of the semiconductor. The protection member may comprise an upper portion with the impurity and a lower portion without impurity.

The display device may further include a color filter formed on the protection member and contacting the protection member.

The display device may further include a capping layer formed on the color filter.

A sum planar shape of the ohmic contacts and the protection member may be substantially the same as a planar shape of the semiconductor.

DETAILED DESCRIPTION

Figure 1:
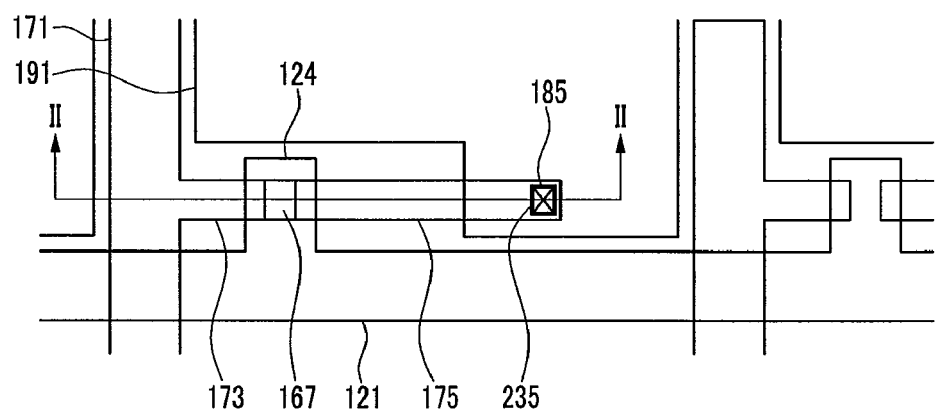
FIG. 1 is a layout view of a display panel according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element, or intervening elements may also be present. In contrast, when an element is referred to as being "directly on" another element, there are no intervening elements present.

Now, a display panel according to an exemplary embodiment of the present invention will be described in detail with reference to FIG. 1 and FIG. 2.

Figure 2:
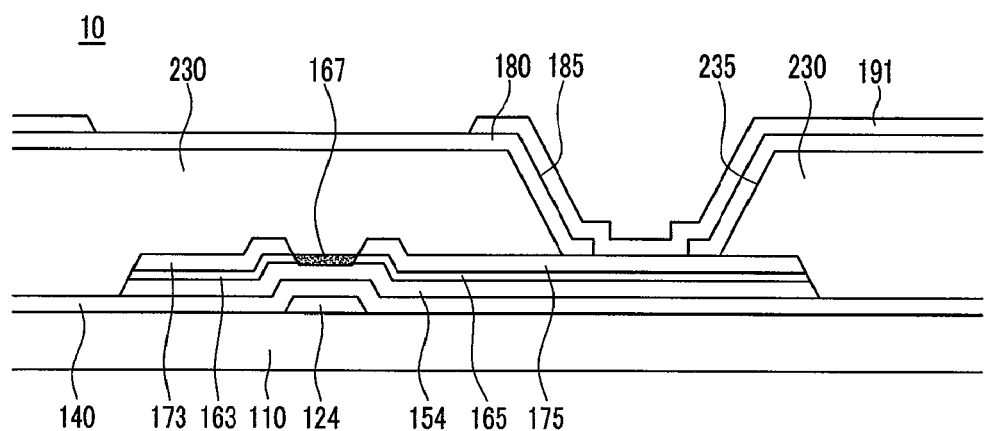
FIG. 2 is a cross-sectional view of the display device shown in FIG. 1 taken along the line II-II.

FIG. 1 is a layout view of a display panel according to an exemplary embodiment of the present invention, and FIG. 2 is a cross-sectional view of the display device shown in FIG. 1 taken along the line II-II.

Referring to FIG. 1 and FIG. 2, a gate line 121, a gate insulating layer 140, a semiconductor 154, ohmic contacts 163 and 165 and a protection member 167, a data line 171, and a drain electrode 175 are sequentially formed on a substrate 110 comprising an insulating material such as glass or plastic.

The gate line 121 transmits gate signals and includes a gate electrode 124, and the data line 171 transmits data signals and includes a source electrode 173 extending toward the gate electrode 124. The drain electrode 175 is separated from the data line 171, and is opposite to the source electrode 173 with respect to the gate electrode 124.

The semiconductor 154 may comprise a material such as hydrogenated amorphous silicon or polysilicon, the ohmic contacts 163 and 165 may comprise amorphous silicon doped with an impurity at a high concentration, or polysilicon with an impurity at a high concentration. The protection member 167 may comprise a portion of the same conductive impurity as the ohmic contacts 163 and 165. The ohmic contacts 163 and 165 may be formed by plasma-treatment under phosphine. Furthermore, the protection member 167 may comprise a silicon oxide or a silicon nitride, and may be formed by another plasma-treatment.

The ohmic contacts 163 and 165 and the protection member 167 are disposed on the semiconductor 154, and the planar shape of the sum of the ohmic contacts 163 and 165 and the protection member 167 is substantially the same as that of the semiconductor 154.

The ohmic contacts 163 and 165 include a first portion disposed under the data line 171 and a second portion disposed under the drain electrode 175, and they may reduce the contact resistance between the semiconductor 154 and the data line 171 and/or the drain electrode 175.

The protection member 167 is disposed between the first portion and the second portion of the ohmic contacts 163 and 165. The protection member 167 is at the same layer as the ohmic contacts 163 and 165 and is continuous with them. Furthermore, the protection member 167 is not covered by the data line 171 and the drain electrode 175.

The protection member 167 and ohmic contact 163 and 165 may be formed of one semiconductor layer doped with an impurity at a high concentration. The protection member 167 may be manufactured by plasma-treating a portion of the impurity semiconductor layer, and the two portions of the impurity semiconductor layer disposed at respective sides of the protection member 167 may be divided from each other by the formation of the protection member 167 and form the first portion and the second portion of the ohmic contacts 163 and 165, respectively.

The protection member 167 connected between the first portion and the second portion of the ohmic contacts 163 and 165 may have a substantially continuous surface with the ohmic contacts 163 and 165.

The protection member 167 may be expanded in a depth direction to the gate electrode 124 consuming a portion of top surface of the semiconductor 154.

The data line 171 and drain electrode 175 may have almost the same planar shape as the ohmic contacts 163 and 165 and almost the same planar shape as the semiconductor 154 except for a portion between the source electrode 173 and the drain electrode 175. However, they may not have the same planar shape in other embodiments.

One gate electrode 124, one source electrode 173, and one drain electrode 175 form a thin film transistor (TFT) along with the semiconductor 154, and a channel of a thin film transistor is formed at the semiconductor 154 between the source electrode 173 and drain electrode 175.

A color filter 230 having an opening 235 is formed on the data line 171, the drain electrode 175, the gate insulating layer 140, and the protection member 167. The color filter 230 may comprise an organic material, and it may display one of the primary colors such as a color from three primary colors of red, green, and blue.

A capping layer 180 is formed on the color filter 230. The capping layer 180 may comprise an inorganic insulator such as a silicon nitride ($SiN_x$) or a silicon oxide ($SiO_x$), or an organic insulator. The capping layer 180 may prevent dispersion of the color filter 230 and suppress contamination of the liquid crystal by an organic material such as a solvent of the color filter such that the deterioration such as the image sticking that may be generated under screen driving may be prevented. The capping layer 180 has a contact hole 185 exposing the drain electrode 175.

The pixel electrode 191 is formed on the capping layer 180. The pixel electrode 191 is connected to the drain electrode 175 through the contact hole 185 and the opening 235, and receives data voltages from the drain electrode 175. The pixel electrode 191 may comprise a transparent conductive material such as ITO or IZO.

Next, a manufacturing method of the display panel having the structure of the embodiments illustrated in FIG. 1 and FIG. 2 will be described with reference to FIG. 3 to FIG. 8 as well as FIG. 1 and FIG. 2, according to one or more embodiments.

FIG. 3 to FIG. 8 are cross-sectional views sequentially showing a manufacturing process of a display panel according to one or more embodiments.

Figure 3:
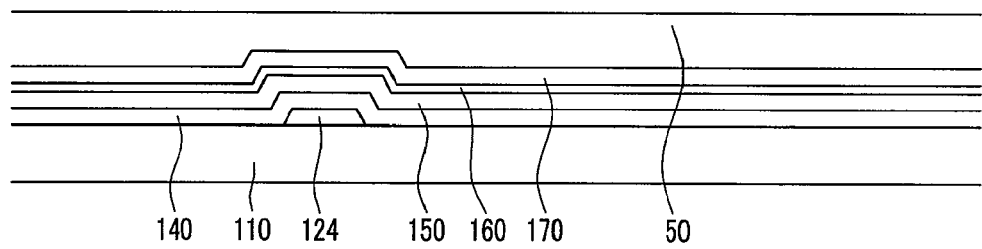
FIG. 3 to FIG. 8 are cross-sectional views sequentially showing a manufacturing process of the display panel according to one or more embodiments.

First, as shown in FIG. 3, a gate line 121 including a gate electrode 124 is formed on a substrate 110. Next, a gate insulating layer 140 that may comprise a silicon nitride, an intrinsic semiconductor layer 150, and an extrinsic semiconductor layer 160 may be sequentially formed by plasma enhanced chemical vapor deposition (PECVD).

The intrinsic semiconductor layer 150 may comprise hydrogenated amorphous silicon, and the extrinsic semiconductor layer 160 may comprise n+ hydrogenated amorphous silicon into which an n-type impurity such as phosphorus (P) is doped at a high concentration. However, a silicide layer may be formed as a substitute for the extrinsic amorphous silicon layer 160.

The thickness of the intrinsic semiconductor layer 150 may be in a range from about 100 Å to about 2000 Å, and the thickness of the extrinsic semiconductor layer 160 may be in a range from about 100 Å to about 500 Å.

In addition, according to an embodiment in which the intrinsic semiconductor layer 150 comprises amorphous silicon, polysilicon may be formed through crystallizing the amorphous silicon using devices such as a laser generator. Polysilicon with high crystallinity may be formed through low energy when the laser is a high frequency and long wavelength laser such as a diode pumped solid state (DPSS) laser. Lateral crystallization may occur by moving a laser in parallel with the intrinsic semiconductor layer 150, and, in this case, uniformity of the semiconductor surface improves. On the other hand, a micro-crystal silicon instead of an amorphous silicon may be used. The intrinsic semiconductor layer 150 may be a hybrid layer comprising a micro-crystal silicon layer and an amorphous silicon layer.

The thickness of the intrinsic semiconductor layer 150 may be in a range from about 100 Å to about 1000 Å. Due to a thinner intrinsic semiconductor layer, response characteristics of a thin film transistor may improve.

The extrinsic semiconductor layer 160 may be formed by plasma-treatment under phosphine. According to an embodiment in which the surface of the intrinsic semiconductor layer 150 comprising polysilicon is treated by plasma under phosphine, the extrinsic semiconductor layer 160 comprising a doped polysilicon on the intrinsic semiconductor layer 150 is formed. The output of radio frequency (RF) is in a range from about 600 W to about 1,400 W, and the time of processing the plasma-treatment may be 90 seconds or less.

Figure 16:
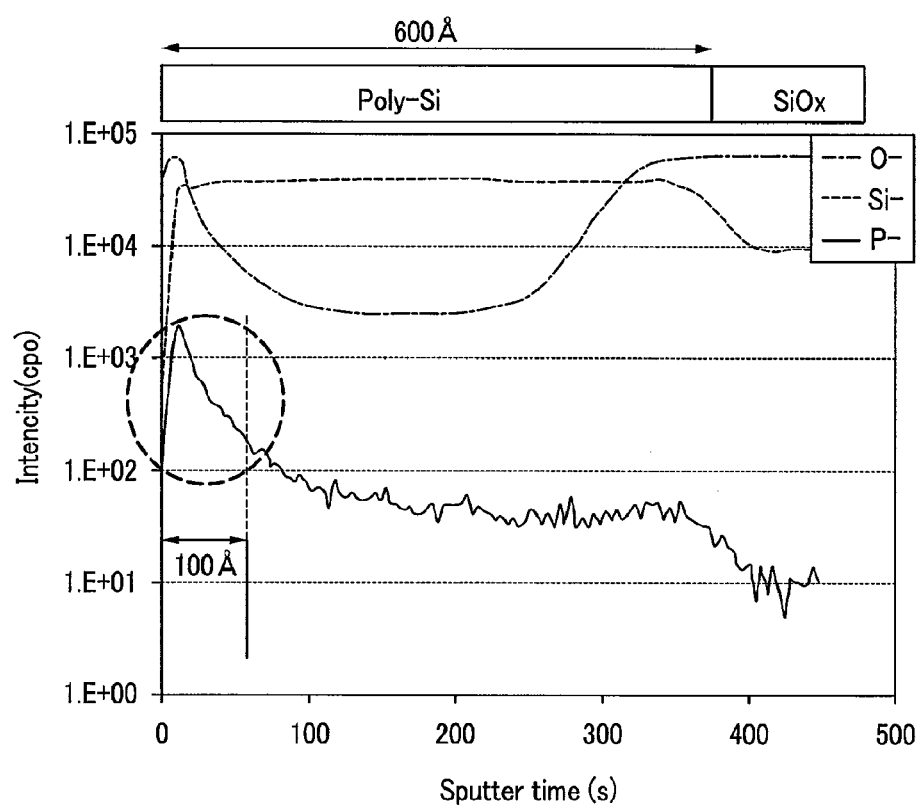
FIG. 16 and FIG. 17 are Time of Flight Secondary Ion Mass Spectrometry (TOF-SIMS) graphs according to one or more embodiments.
Figure 17:
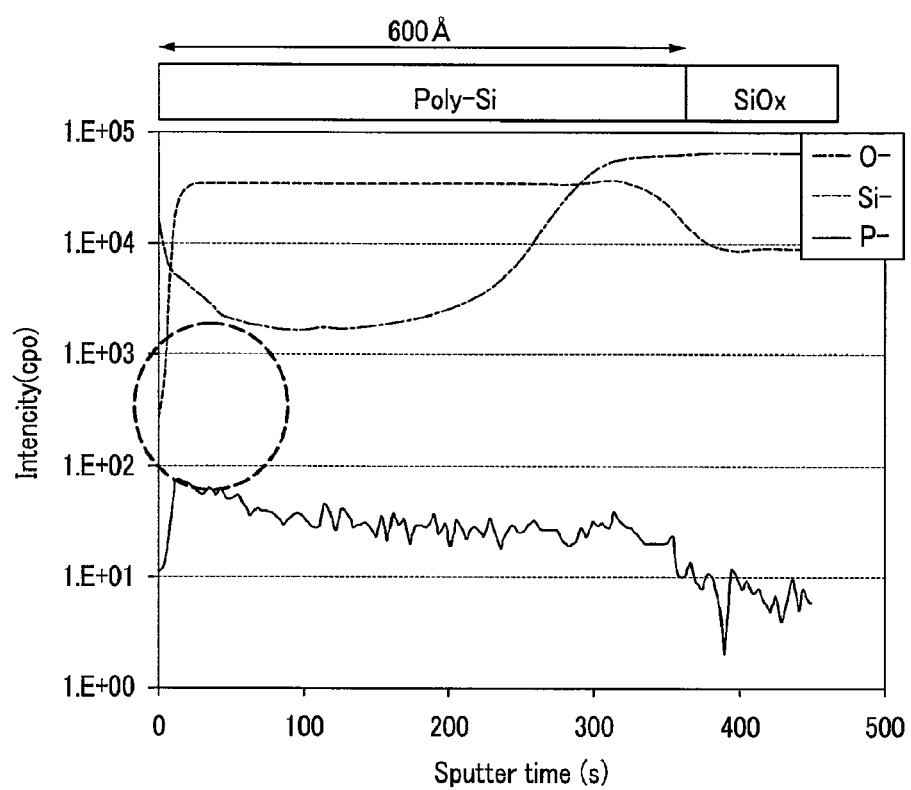

The thickness of the extrinsic semiconductor layer 160 may be in a range from about 10 Å to about 100 Å. Due to a thinner extrinsic semiconductor layer 160, characteristics of the interface between dopants and polysilicon may be maintained. Also, the protection member 167 may be eliminated by a simple cleaning process using a material such as hydrogen fluoride instead of a dry etching process which is a time and cost consuming process. The time of processing a dry etch may be about 5 minutes. FIG. 16 and FIG. 17 are Time of Flight Secondary Ion Mass Spectrometry (TOF-SIMS) graphs according to one or more embodiments. FIG. 16 shows a before-HF-cleaning structure, and FIG. 17 shows an after-HF-cleaning structure. As compared FIG. 16 with FIG. 17, a concentration of phosphorous atom is reduced, which means the protection member 167 may be eliminated through the HF-cleaning process. Consequently, a leakage current of the thin film transistor caused by residual conducting elements such as phosphorous atoms in the protection member 167 not reacting with incorporated oxygen atoms through a plasma-treatment may be reduced.

The intrinsic semiconductor layer 150 comprising polysilicon may be cleaned by materials such as hydrogen fluoride. This cleaning may be performed before forming the extrinsic semiconductor layer 160, and unnecessary by-products on the surface of the intrinsic semiconductor layer 150 are eliminated by the cleaning. As a result, reactivity between polysilicon and phosphorous (P) improves in this case when forming the extrinsic semiconductor layer 160. Further, the extrinsic semiconductor layer 160 is not etched by the cleaning because the cleaning is performed before forming the extrinsic semiconductor layer 160.

Next, a conductor layer 170 comprising a chemically resistant metal such as molybdenum, chromium, tantalum, copper, or titanium is deposited by sputtering on the extrinsic semiconductor layer 160. Next, a photosensitive film 50 is coated through spin coating on the conductor layer 170.

Figure 4:
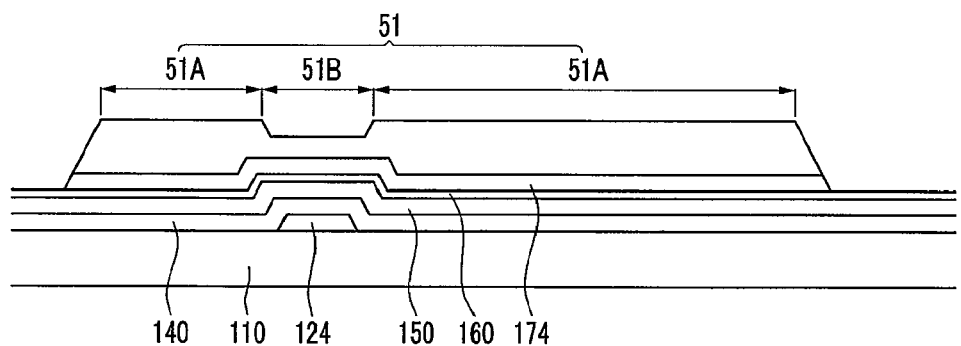

As shown in FIG. 4, the photosensitive film 50 is then exposed and developed to form a photosensitive member 51. The photosensitive member 51 includes a first portion 51A and a second portion 51B that is thinner than the first portion 51A. For convenience of explanation, but without limiting the scope of the present embodiment, a first portion denotes portions of the conductor layer 170, the extrinsic semiconductor layer 160, and the intrinsic semiconductor layer 150 that are disposed under the first portion 51A of the photosensitive member 51, a second portion denotes portions thereof disposed under the second portion 51B, and a third portion denotes portions thereof disposed under remaining portions.

Next, the third portion of the conductor layer 170 that is not covered by the photosensitive member 51, and is exposed, may be removed by wet etching to form a data conductor 174. Alternatively, the data conductor 174 may be formed by dry etching.

Figure 5:
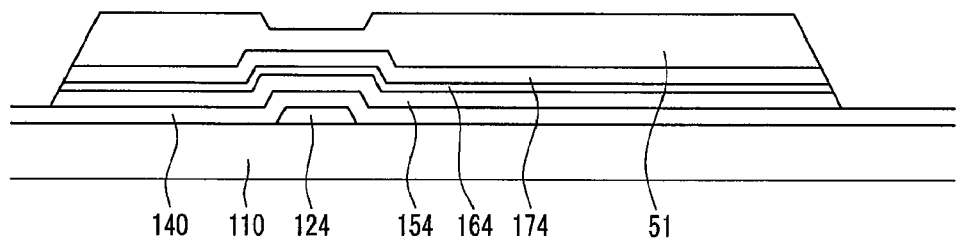

As shown in FIG. 5, the third portions of the extrinsic semiconductor layer 160 and the intrinsic semiconductor layer 150 may be dry-etched to form an intrinsic semiconductor 154 and an extrinsic semiconductor 164.

Figure 6:
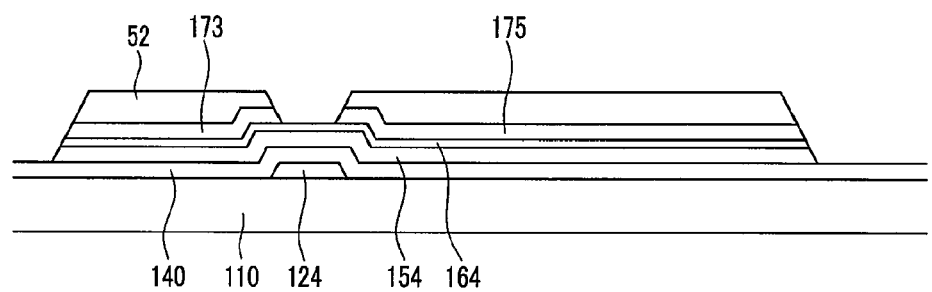

Next, as shown in FIG. 6, the second portion 51B of the photosensitive member 51 is removed and the thickness of the first portion 51A is reduced. In the embodiment of FIG. 6, reference numeral 52 indicates the first portion 51A of the photosensitive member 51 of which the thickness is reduced, and this portion may again be used as a photosensitive member. The second portion of the data conductor 174 that is not covered by the photosensitive member 52, and is exposed, may then be dry-etched to divide a data line 171 to include a source electrode 173 and a drain electrode 175 that are discontinuous from each other. Thus, the second portion of the extrinsic semiconductor 164 is exposed.

Figure 7:
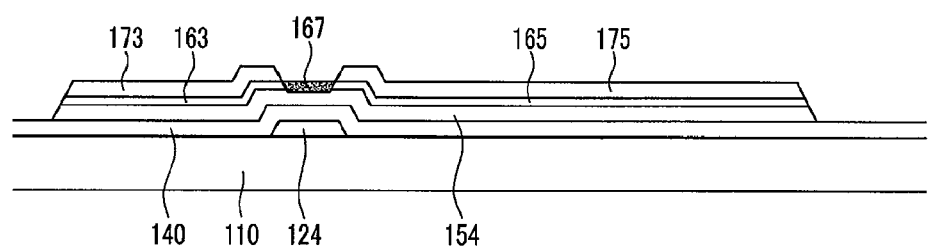

Next, as shown in FIG. 7, the second portion of the extrinsic semiconductor 164 may be treated by plasma to form a protection member 167 that may comprise a silicon oxide. The protection member 167 may alternatively comprise a nitride material. Accordingly, the extrinsic semiconductor 164 is divided into the protection member 167 and the ohmic contacts 163 and 165 disposed on respective sides of the protection member 167. Here, the plasma treatment may be applied to the intrinsic semiconductor 154 such that the protection member 167 may be formed inside the intrinsic semiconductor 154. All available devices that may generate the plasma such as a chemical vapor deposition apparatus and/or an etch apparatus may be used for the plasma treatment. For example, PE (plasma etching), RIE (reactive ion etching), ECCP (enhanced capacitive coupled plasma), DFCCP (dual frequency capacitive coupled plasma), or ICP (inductively coupled plasma) may be used. The gas for the plasma treatment may be almost all oxygen gas ($O_2$), and in addition, argon (Ar) or helium (He) may be added.

When executing the plasma treatment, radio frequency (RF) power, pressure, kind of gas, amount of gas, process time, etc., may be variously designed according to the apparatus used and the thickness of the extrinsic semiconductor 164. That is, the process conditions of the apparatus may be controlled to plasma-treat the entire thickness of the extrinsic semiconductor 164.

For example, when a dry etch apparatus is used, the process conditions include RF power of 1300 W(source)/400 W(bias), pressure of 50 mTorr, oxygen gas ($O_2$) and argon (Ar) with amounts of gas ($O_2$/Ar) of 400/100 sccm, and process time of 60 seconds. As a result, a protection member having a thickness of 342 Å may be obtained. The protection member 167 was formed on the exposed second portion of the extrinsic semiconductor 164 with a thickness of about 100 Å by using the dry etching apparatus including the RIE/ECCP having strong anisotropy, and then characteristics of the thin film transistor were measured.

Figure 14:
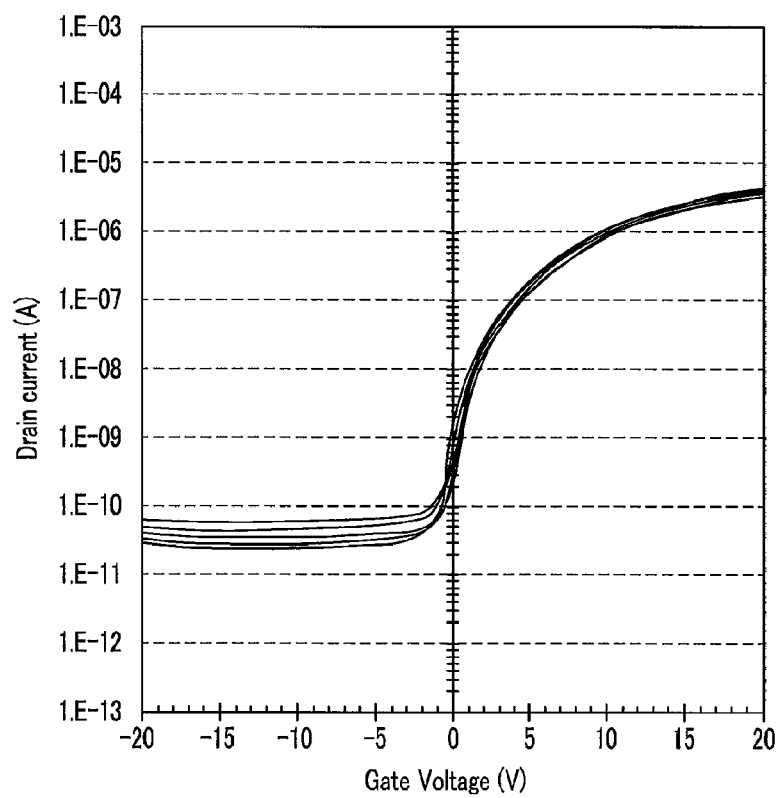
FIG. 14 and FIG. 15 are graphs of the results of the operations of the thin film transistors according to one or more embodiments.
Figure 15:
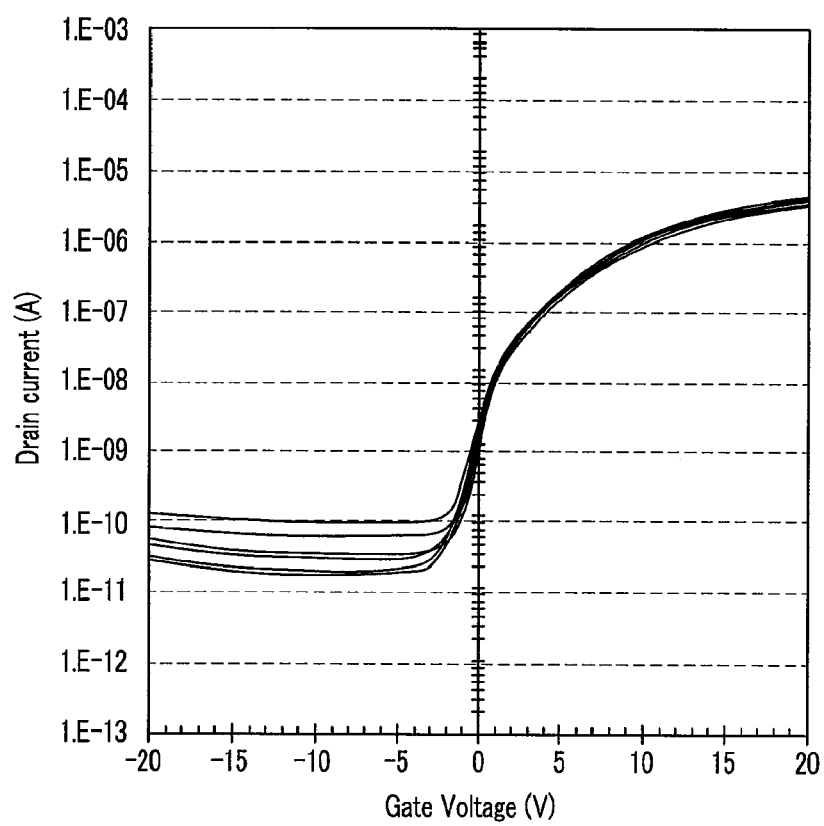

FIG. 14 is a graph showing the operation result of the thin film transistor after forming the protection member 167 according to an embodiment with the process conditions of the RF power of 1300 W(source)/400 W(bias), the pressure of 15 mTorr, the use of oxygen gas ($O_2$) with an amount of gas of 100 sccm, and the process time of 5 minutes. FIG. 15 is a graph showing the operation result of the thin film transistor after forming the protection member 167 according to another embodiment with the process conditions of the RF power of 1300 W(source)/400 W(bias), the pressure of 15 mTorr, the use of the oxygen gas ($O_2$) and argon (Ar) with an amount of gas of 50/200 sccm ($O_2$/Ar), and the process time of 5 minutes. As shown in FIG. 14 and FIG. 15, when an "off" voltage was −7V, the drain current was determined to be in a range from about $10^{-10}$ A to about $10^{-11}$ A, and when an "on" voltage was 20V, the drain current was determined to be in a range from about $10^{-5}$ A to about $10^{-6}$ A. Therefore, it was confirmed that the thin film transistors operated normally.

Accordingly, the intrinsic semiconductor layer 150 may be deposited with the original necessary thickness plus an additional thickness. In more detail, when the exposed second portion of the extrinsic semiconductor 164 is removed to expose the intrinsic semiconductor 154, the etch process is sufficiently executed to completely remove remnants of the extrinsic semiconductor 164 such that the portion of the intrinsic semiconductor 154 may be etched. Accordingly, when depositing the intrinsic amorphous silicon layer 150, the intrinsic semiconductor layer 150 may be deposited with a greater thickness than the necessary resultant thickness (for example 100 Å to 2000 Å). However, in the present exemplary embodiment, when the second portion of the extrinsic semiconductor 164 is completely oxidized in the process of the plasma treatment, because the intrinsic semiconductor 154 is slightly oxidized, the intrinsic semiconductor layer 150 may be deposited with the necessary resultant thickness (for example, 100 Å to 2000 Å) that is required to form the channel of the thin film transistor.

This plasma treatment process may be executed under the condition in which the photosensitive member 52 remains on the source electrode 173 and the drain electrode 175. However, the plasma treatment process may be executed under the condition in which the photosensitive member 52 is removed through an ashing process. In this case, the source electrode 173 and the drain electrode 175 may be oxidized, but if the condition of the plasma treatment is controlled, damage to the source electrode 173 and the drain electrode 175 may be prevented. Also, when the source electrode 173 and the drain electrode 175 are formed of a metal having a low affinity to oxidization such as copper, the oxidization thereof may be ignored.

In addition, the process for the plasma treatment may be executed in the same chamber along with the etch process for the formation of the intrinsic semiconductor 154 and the extrinsic semiconductor 164, the ashing process for the formation of the photosensitive member 52, and the etch process for the formation of the source electrode 173 and the drain electrode 175. Furthermore, the conductor layer 170 may be dry-etched to form the data conductor 174, and this process may be executed in the same chamber. Accordingly, all processes may be speedily and simply executed in one chamber, from depositing the conductor layer 170 until the plasma treatment.

Figure 8:
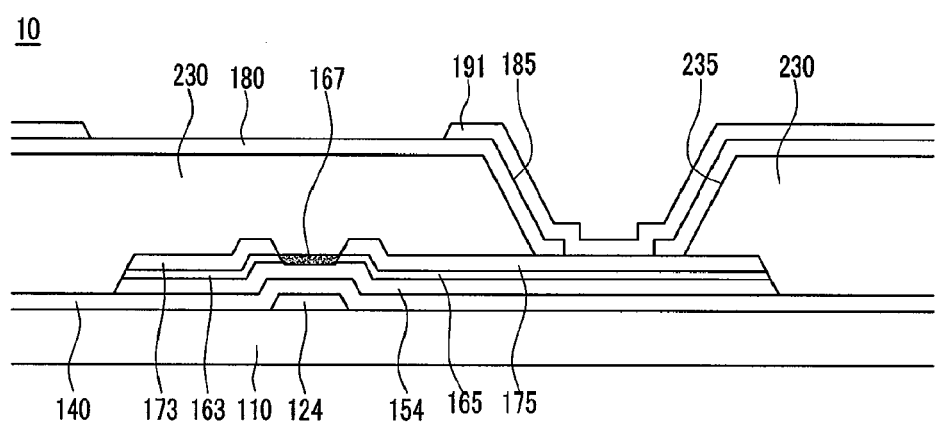

Next, as shown in FIG. 8, the color filter 230 having the opening 235 may be formed. When the protection member 167 does not exist, since the color filter 230 comprises an organic material, the intrinsic semiconductor 154 that contacts the color filter 230 may be damaged during the formation of the color filter 230. It will be appreciated that this danger is not generated in the present exemplary embodiment. Also, the function of the semiconductor 154 is not deteriorated by the color filter 230 after forming the color filter 230.

Next, a capping layer 180 comprising an inorganic insulator is formed and patterned by photolithography to form a contact hole 185 exposing the drain electrode 175.

The thickness of the capping layer 180 may be in a range from about 100 Å to about 2000 Å. When the thickness of the capping layer 180 is less than about 100 Å, it may be difficult for the thickness of the capping layer 180 to be uniform, and when the thickness thereof is more than about 2000 Å, the protection effect according to the increased thickness may not increase.

Next, a transparent conductive material such as ITO or IZO may be deposited by sputtering on the capping layer 180 and patterned to form a pixel electrode 191.

Thus, the process for etching the extrinsic semiconductor 164 to expose the channel of the intrinsic semiconductor 154 and the process for forming the inorganic insulating layer to protect the channel of the intrinsic semiconductor 154 may be omitted. Accordingly, the manufacturing process of the display panel 10 may be simplified, and furthermore a reduction of manufacturing cost and an improvement in productivity may be obtained.

Also, by executing the plasma treatment, it is not necessary for the display panel to be soaked in an electrolyte solution of a high price such as in an anodic oxidation process, such that the process may be simplified and the cost may be reduced. Furthermore, when the display panel is soaked in the electrolyte solution for the anodic oxidation process, particles may cover the oxidized portion, however, this deterioration may be prevented by using the plasma treatment.

An additional photolithography is also required for the anodic oxidation process, and furthermore the display panel is soaked in the electrolyte solution such that an apparatus including a solution instrument that is larger than the display panel is required. In addition, the number of display panels for which the anodic oxidation process may be executed by using the electrolyte solution of one solution instrument is restricted to less than about 200 sheets. However, the plasma treatment may be executed to form the protection member in the present exemplary embodiment such that the photolithography process and the apparatus including the solution having the electrolyte solution may not be necessary, and it may not be necessary for the electrolyte solution to be changed every 200 sheets. Accordingly, the manufacturing process may be speedily and simply executed and the manufacturing cost may be reduced.

On the other hand, when the capping layer 180 is formed of the organic layer without the application of the color filter 230, the protection member 167 also has the same functions.

Next, a display device according to another exemplary embodiment of the present invention will be described in detail with reference to FIG. 9 to FIG. 12. The present exemplary embodiment is described using a liquid crystal display, however, it will be understood that embodiments of the present invention may be adapted to various kinds of display devices, and the range of the embodiments of the present invention is not restricted to the liquid crystal display.

Figure 9:
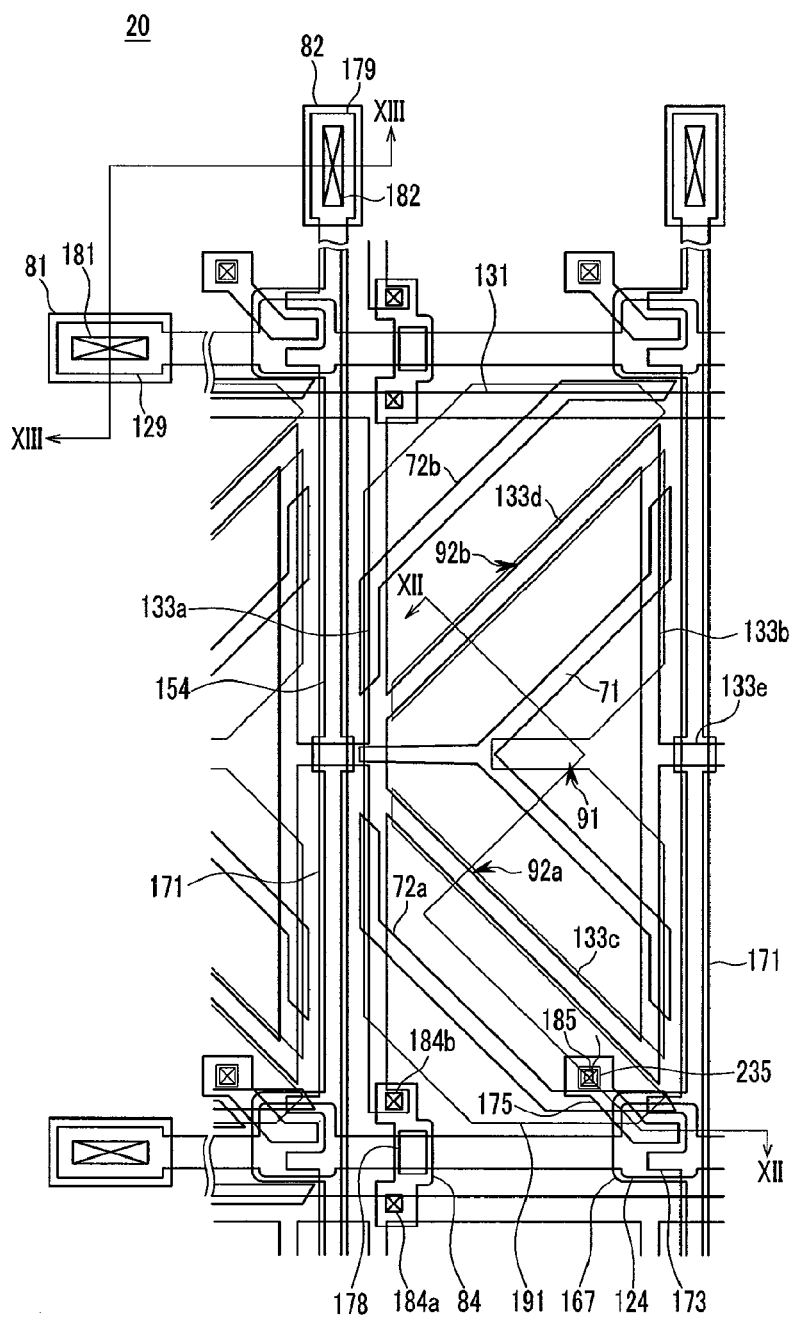
FIG. 9 is a layout view of a display device according to another exemplary embodiment of the present invention.
Figure 10:
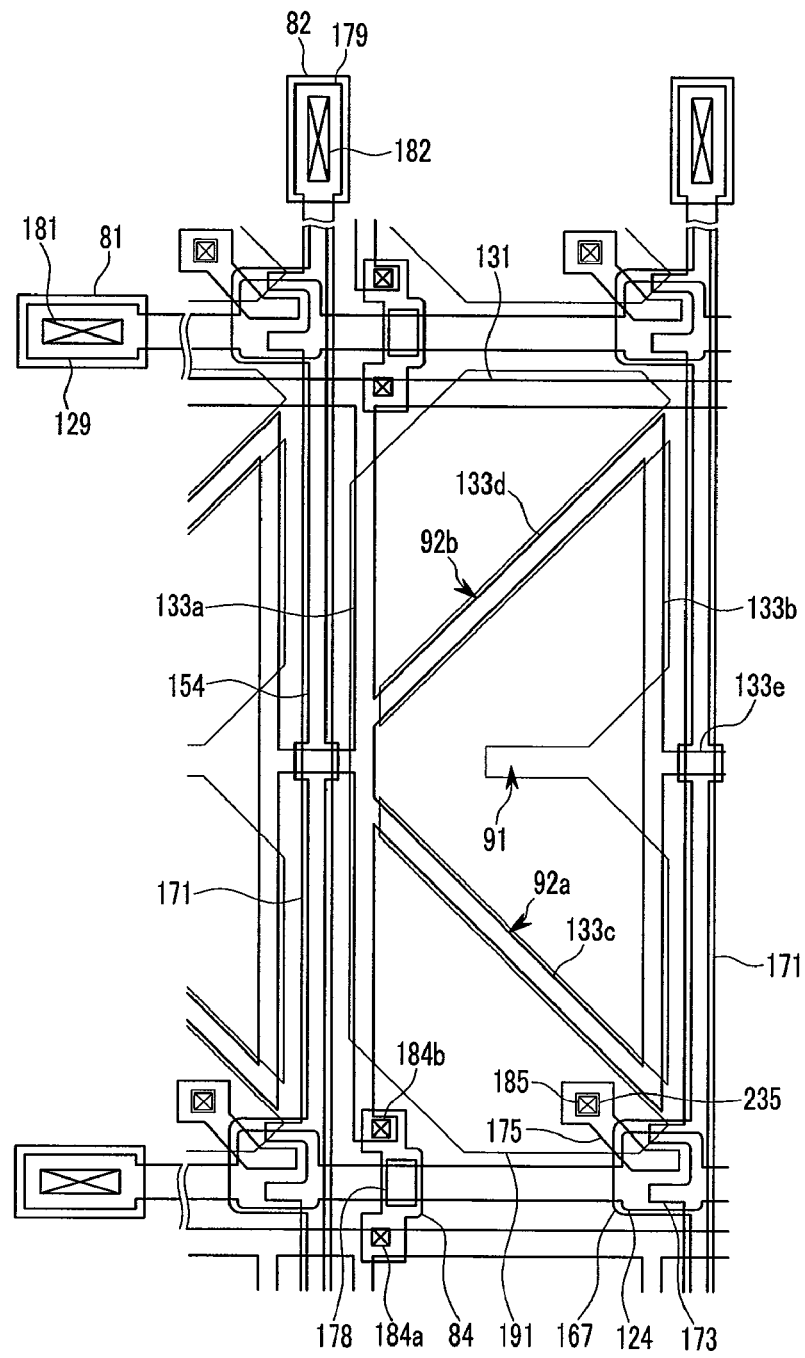
FIG. 10 is a layout view of the thin film transistor array panel shown in FIG. 9.
Figure 11:
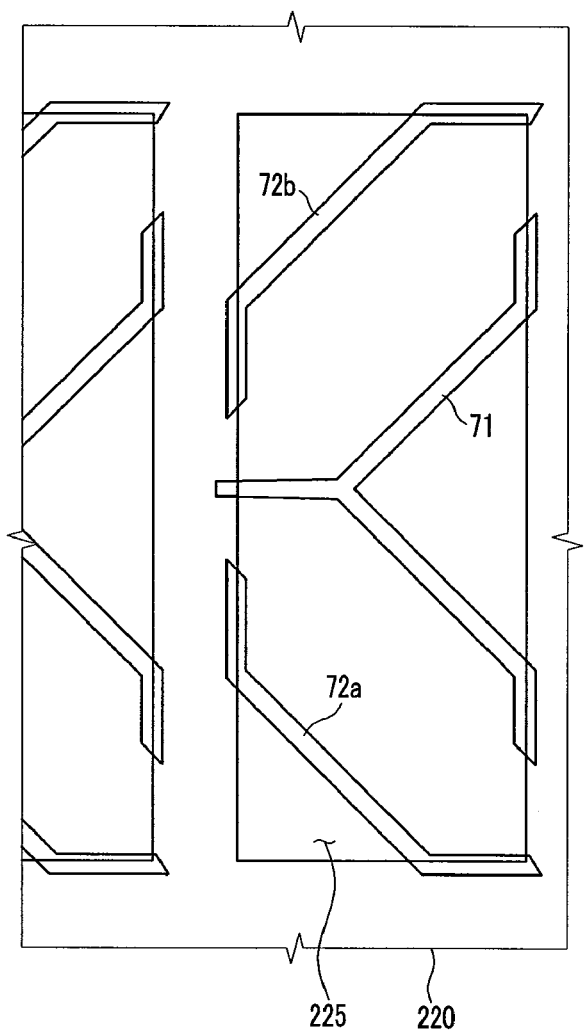
FIG. 11 is a layout view of the common electrode panel shown in FIG. 9.
Figure 12:
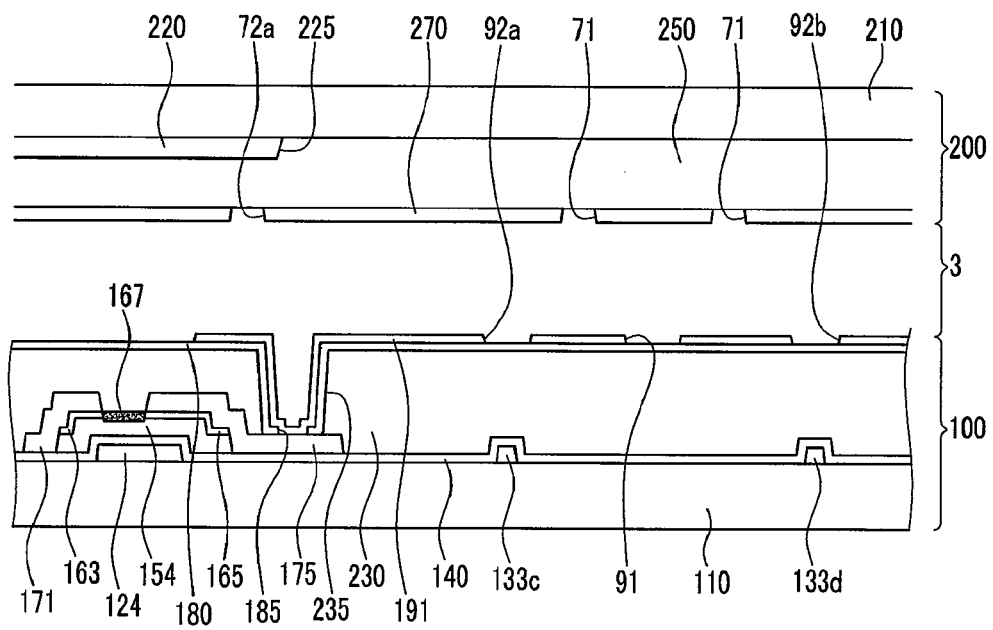
FIG. 12 is a cross-sectional view of the display device shown in FIG. 9 taken along the line XII-XII.
Figure 13:
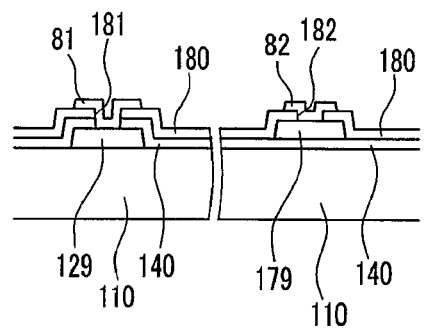
FIG. 13 is a cross-sectional view of the display device shown in FIG. 9 taken along the line XIII-XIII.

FIG. 9 is a layout view of a display device according to another exemplary embodiment of the present invention, FIG. 10 is a layout view of the thin film transistor array panel shown in FIG. 9, FIG. 11 is a layout view of the common electrode panel shown in FIG. 9, FIG. 12 is a cross-sectional view of the display device shown in FIG. 9 taken along the line XII-XII, and FIG. 13 is a cross-sectional view of the display device shown in FIG. 9 taken along the line XIII-XIII.

Referring to FIG. 9, FIG. 10, FIG. 12, and FIG. 13, a liquid crystal display 20 includes a thin film transistor array panel 100, a common electrode panel 200, and a liquid crystal layer 3.

First, the thin film transistor array panel 100 will be described according to one or more embodiments. The structure of the thin film transistor array panel 100 is almost the same as that of the exemplary embodiment shown in FIG. 1 and FIG. 2.

A plurality of gate lines 121 and a plurality of storage electrode lines 131 are formed on an insulating substrate 110.

The gate lines 121 extend substantially in a transverse direction and transmit gate signals. Each gate line 121 includes a plurality of gate electrodes 124 and an end portion 129 having a large area for connection with another layer or an external driving circuit.

The storage electrode lines 131 are supplied with a predetermined voltage such as a common voltage, and include a plurality of stem lines parallel to the gate lines 121 and a plurality of storage electrodes 133a, 133b, 133c, and 133d, and a plurality of connections 133e.

A gate insulating layer 140 is formed on the gate lines 121 and the storage electrode lines 131. A plurality of semiconductor stripes 154 that may comprise hydrogenated amorphous silicon or polysilicon are formed on the gate insulating layer 140.

A plurality of ohmic contacts 163 and 165 and a plurality of protection members 167 are formed on the semiconductors 154.

A plurality of data lines 171, a plurality of drain electrodes 175, and a plurality of isolated metal pieces 178 are formed on the ohmic contacts 163 and 165, and on the gate insulating layer 140.

The data lines 171 transfer data signals and basically extend in a vertical direction, thereby crossing the gate lines 121 and the stem lines and connections 133e of the storage electrode lines 131. Each data line 171 includes a plurality of source electrodes 173 extending toward the gate electrodes 124, and a wide end 179 for connection to another layer or an external driving circuit. The drain electrodes 175 are separated from the data lines 171 and face the source electrodes 173 with respect to the gate electrodes 124. The isolated metal pieces 178 are disposed on the gate lines 121 neighboring the first storage electrodes 133a.

The semiconductors 154 extend in a vertical direction and include a plurality of protrusions extending toward the gate electrodes 124 and the drain electrodes 175. The semiconductors 154 include portions that are exposed without being covered by the data lines 171 and the drain electrode 175 as well as between the source electrode 173 and the drain electrode 175.

The ohmic contacts 163 and 165 may comprise amorphous silicon doped with an impurity at a high concentration or polysilicon. The ohmic contacts 163 and 165 may be formed by plasma-treatment under phosphine. The protection member 167 may comprise a silicon oxide or a silicon nitride. The protection member 167 may also be formed by another plasma-treatment.

The ohmic contacts 163 and 165 include first portions disposed between the semiconductors 154 and the data lines 171 and second portions disposed between the semiconductors 154 and the drain electrodes 175, thereby reducing the contact resistance between the semiconductors 154 and the data lines 171 and/or drain electrodes 175.

A plurality of protection members 167 are formed between the first portions and the second portions of ohmic contacts 163 and 165. The protection members 167 are disposed at the same layer as the ohmic contacts 163 and 165 and are continuous with them, and are not covered by the data lines 171 and drain electrodes 175.

The protection members 167 and the ohmic contacts 163 and 165 may be formed of one semiconductor layer that is doped with an impurity at a high concentration. The protection members 167 may be made by plasma-treating a portion of the extrinsic semiconductor layer, and portions of the extrinsic semiconductor layer disposed on both sides of the protection member 167 are divided by forming the protection member 167 such that the first portions and the second portions of ohmic contacts 163 and 165 are formed. The protection member 167 may comprise a silicon oxide or a silicon nitride.

A plurality of color filters 230 having a plurality of openings 235 are formed on the data lines 171, the drain electrodes 175, the gate insulating layer 140, the isolated metal pieces 178, and the protection members 167. The color filters 230 may comprise an organic material, and may display one of the primary colors such as one of three primary colors of red, green, and blue.

A capping layer 180 is formed on the color filters 230. The capping layer 180 has a plurality of contact holes 182 and 185 respectively exposing the end portions 129 and 179 of the data lines 171 and the drain electrodes 175. The capping layer 180 and the gate insulating layer 140 have a plurality of contact holes 181, 184a, and 184b respectively exposing the end portions 129 of the gate lines 121 and the portions of the storage electrode lines 131.

A plurality of pixel electrodes 191, a plurality of contact assistants 81 and 82, and a plurality of connecting bridges 84 are formed on the capping layer 180. They may comprise a transparent conductor such as ITO or IZO, or a reflective conductor such as aluminum, silver, or alloys thereof. The pixel electrodes 191 are connected to the drain electrodes 175 through the contact holes 185.

The pixel electrodes 191 overlap the storage electrode lines 131 as well as the storage electrodes 133a, 133b, 133c, and 133d. A plurality of cutouts 91, 92a, and 92b are formed in the pixel electrodes 191, and the pixel electrodes 191 are divided into a plurality of regions by the cutouts 91, 92a, and 92b. The number of cutouts may be varied depending on design factors such as the size of pixels, the ratio of the transverse edges and the longitudinal edges of the pixel electrodes, the type and characteristics of the liquid crystal layer 3, and so on.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and complement the adhesion of the end portions 129 and 179 and external devices.

The connection bridges 84 intersect the gate lines 121, and are connected to the exposed portions of the storage electrodes 131 through the contact holes 184a and 184b that are opposite to each other with the gate lines 121 therebetween. The storage electrode lines 131 and the connecting bridges 84 may be used for repairing defects of the gate lines 121, the data lines 171, or the thin film transistors.

In the present exemplary embodiment, the order of forming the semiconductors 154, the ohmic contacts 163 and 165, the source electrodes 173, and the drain electrodes 175 is different from the order shown in the embodiments of FIG. 3 to FIG. 8.

First, an intrinsic amorphous silicon layer and an extrinsic amorphous silicon layer are formed on a gate insulating layer 140, and the intrinsic amorphous silicon layer and the extrinsic amorphous silicon layer may be dry-etched by using a mask to form a plurality of semiconductors 154 and a plurality of extrinsic semiconductors. Next, a conductor layer may be formed by sputtering on the gate insulating layer 140 and the extrinsic semiconductor, and patterned by wet-etching or dry-etching to divide into the source electrodes 173 the drain electrodes 175. Here, the portions of the extrinsic semiconductors are exposed between the source electrodes 173 and the drain electrodes 175. Next, the exposed extrinsic semiconductors are plasma-treated to form a plurality of protection members 167. Accordingly, the extrinsic semiconductors are divided into the protection member 167 and the ohmic contacts 163 and 165 that are disposed on respective sides thereof. Here, the plasma treatment may be applied through to the semiconductor 154 such that the protection member 167 may be formed on the semiconductor 154.

Next, the common electrode panel 200 will be described in detail according to one or more embodiments with reference to FIG. 9, FIG. 11, and FIG. 12.

A light blocking member 220 is formed on a substrate 210. The light blocking member 220 includes a plurality of openings 225 that face the pixel electrodes 191 and have substantially the same shape as the pixel electrodes 191, thereby preventing light leakage between the pixel electrodes 191. An insulating layer 250 is formed on the light blocking member 220 for providing a flat surface. The insulating layer 250 may be omitted.

A common electrode 270 that may comprise a transparent conductor such as ITO or IZO is formed on the insulating layer 250. The common electrode 270 includes a plurality of sets of cutouts 71, 72a, and 72b. The shape of the cutouts 71, 72a, and 72b may be changed according to design elements.

The liquid crystal layer 3 is disposed between the thin film transistor array panel 100 and the common electrode panel 200.

The liquid crystal display 20 may include a backlight unit (not shown) for supplying light to the thin film transistor array panel 100, the common electrode panel 200, and the liquid crystal layer 3.

According to an exemplary embodiment of the present invention, the extrinsic semiconductor may be plasma-treated such that the process for etching the extrinsic semiconductor and forming an inorganic insulating layer for protecting the intrinsic semiconductor may be omitted. Accordingly, the manufacturing process of the display panel may be simplified, the manufacturing cost may be reduced and productivity may be improved.

Also, according to an exemplary embodiment of the present invention, the process for the plasma treatment may be executed in the same chamber along with the etch process for the formation of the extrinsic semiconductor, the ashing process for the formation of the photosensitive member, and the etch process for the formation of the source electrode and the drain electrode, such that the manufacturing process may be speedily and simply executed.

According to an exemplary embodiment of the present invention, it is not necessary for the display panel to be soaked in an electrolyte solution of a high price such as in an anodic oxidation process, so that the process may be simplified and the cost may be reduced. Also, when the display panel is soaked in the electrolyte solution for the anodic oxidation process, particles may cover the oxidized portion, however, this deterioration may be prevented by using the plasma treatment.

According to an exemplary embodiment of the present invention, because the thin doped polysilicon layer is formed by plasma-treatment of the thin polysilicon layer under phosphine, characteristics of the interface between dopants and polysilicon are maintained and the time of forming the protective member is reduced, thereby improving the response characteristics of a thin film transistor and productivity.

While practical exemplary embodiments have been described, it is to be understood that the disclosure is not limited to the disclosed embodiments, but, on the contrary, is intended to cover various modifications and equivalent arrangements included within the spirit and scope of the appended claims.

What is claimed is:

1. A manufacturing method of a display panel, comprising:
   forming a gate line including a gate electrode on a substrate;
   forming a gate insulating layer on the gate electrode;
   forming an intrinsic semiconductor on the gate insulating layer;
   cleaning the intrinsic semiconductor after forming the intrinsic semiconductor;
   forming an extrinsic semiconductor on the intrinsic semiconductor after cleaning the intrinsic semiconductor layer;
   forming a data line including a source electrode and a drain electrode on the extrinsic semiconductor; and
   plasma-treating a portion of the extrinsic semiconductor between the source electrode and the drain electrode so as to form a protection member comprising at least one of a silicon oxide and a nitride material, respective sides of the protection member comprising ohmic contacts.

2. The manufacturing method of claim 1, wherein the cleaning the intrinsic semiconductor uses hydrogen fluoride.

3. A manufacturing method of a display panel, comprising:
   forming a gate line including a gate electrode on a substrate;
   forming a gate insulating layer on the gate electrode;
   forming an intrinsic semiconductor on the gate insulating layer;
   forming an extrinsic semiconductor on the intrinsic semiconductor;
   forming a data line including a source electrode and a drain electrode on the extrinsic semiconductor;
   plasma-treating the extrinsic semiconductor between the source electrode and the drain electrode so as to form a protection member comprising at least one of a silicon oxide and a nitride material, respective sides of the protection member comprising ohmic contacts; and
   plasma-treating a portion of the intrinsic semiconductor between the source electrode and the drain electrode,
   wherein the plasma-treating the extrinsic semiconductor further comprises plasma-treating an entire thickness of the extrinsic semiconductor.

4. The manufacturing method of claim 3, further comprising forming a photosensitive member on a source electrode region, a drain electrode region and a channel forming region, wherein the plasma-treating a portion of the extrinsic semiconductor and the plasma treating the intrinsic semiconductor are performed while the photosensitive member remains on the source electrode and the drain electrode.

5. The manufacturing method of claim 4, further comprising etching the extrinsic semiconductor and the intrinsic semiconductor, and ashing the photosensitive member on the channel forming region, wherein the forming a data line, the etching the extrinsic semiconductor and the intrinsic semiconductor, the ashing the photosensitive member on the channel forming region and the plasma-treating are performed in a same chamber.

6. A manufacturing method of a display panel, comprising:
   forming a gate line including a gate electrode on a substrate;
   forming a gate insulating layer on the gate electrode;
   forming an intrinsic semiconductor on the gate insulating layer;
   forming an extrinsic semiconductor on the intrinsic semiconductor;
   forming a data line forming material on the extrinsic semiconductor;
   forming a photosensitive member on a source electrode region, a drain electrode region and a channel forming region;
   forming a data line including a source electrode and a drain electrode on the extrinsic semiconductor;
   plasma-treating a portion of the extrinsic semiconductor between the source electrode and the drain electrode so as to form a protection member comprising at least one of a silicon oxide and a nitride material, respective sides of the protection member comprising ohmic contacts,
   wherein the plasma-treating a portion of the extrinsic semiconductor is performed while the photosensitive member remains on the source electrode and the drain electrode.

7. The manufacturing method of claim 6, further comprising etching the extrinsic semiconductor and the intrinsic semiconductor, and ashing the photosensitive member on the channel forming region, wherein the forming a data line, the etching the extrinsic semiconductor and the intrinsic semiconductor layer, the ashing the photosensitive member on the channel forming region and the plasma-treating a portion of the extrinsic semiconductor are performed in a same chamber.

8. A manufacturing method of a display panel, comprising:
   forming a gate line including a gate electrode on a substrate;
   forming a gate insulating layer on the gate electrode;
   forming an intrinsic semiconductor on the gate insulating layer;
   forming an extrinsic semiconductor on the intrinsic semiconductor;
   forming a data line forming material on the extrinsic semiconductor;
   forming a photosensitive pattern on a source electrode region, a drain electrode region and a channel forming region,
   etching the data line forming material, the extrinsic semiconductor and the intrinsic semiconductor;
   ashing the photosensitive member on the channel forming region;
   etching the data line forming material on the channel forming region; and plasma-treating a portion of the extrinsic semiconductor between the source electrode and the drain electrode so as to form a protection member comprising at least one of a silicon oxide and a nitride material, respective sides of the protection member comprising ohmic contacts, wherein the forming a data line forming material, the etching an extrinsic semiconductor and an intrinsic semiconductor, the ashing the photosensitive member on the channel forming region and the plasma-treating a portion of the extrinsic semiconductor are performed in a same chamber.

9. A manufacturing method of a display panel, comprising:
forming a gate line including a gate electrode on a substrate;
forming a gate insulating layer on the gate electrode;
forming an intrinsic semiconductor on the gate insulating layer;
forming an extrinsic semiconductor on the intrinsic semiconductor;
forming a data line including a source electrode and a drain electrode on the extrinsic semiconductor; and
plasma-treating the extrinsic semiconductor between the source electrode and the drain electrode so as to form a protection member comprising at least one of a silicon oxide and a nitride material, respective sides of the protection member comprising ohmic contacts; and
plasma-treating a portion of the intrinsic semiconductor between the source electrode and the drain electrode.

10. The manufacturing method of claim 9, further comprising forming a photosensitive member on a source electrode region, a drain electrode region and a channel forming region, wherein the plasma-treating the extrinsic semiconductor and the plasma-treating a portion of the intrinsic semiconductor are performed while the photosensitive member remains on the source electrode and the drain electrode.

11. The manufacturing method of claim 10, further comprising etching an extrinsic semiconductor and an intrinsic semiconductor, and ashing the photosensitive member on the channel forming region, wherein the forming a data line, the etching an extrinsic semiconductor and an intrinsic semiconductor, the ashing the photosensitive member on the channel forming region and the plasma-treating are performed in a same chamber.

12. The manufacturing method of claim 9, further comprising forming a photosensitive member on a source electrode region, a drain electrode region and a channel forming region, etching an extrinsic semiconductor and an intrinsic semiconductor, and ashing the photosensitive member on the channel forming region, wherein the forming a data line, the etching an extrinsic semiconductor layer and an intrinsic semiconductor layer, the ashing the photosensitive member on the channel forming region and the plasma-treating a portion of the extrinsic semiconductor and the plasma-treating a portion of the intrinsic semiconductor are performed in a same chamber.

13. A manufacturing method of a display panel, comprising:
forming a gate line including a gate electrode on a substrate;
forming a gate insulating layer on the gate electrode;
forming an intrinsic semiconductor on the gate insulating layer;
forming an extrinsic semiconductor on the intrinsic semiconductor;
forming a data line forming material on the extrinsic semiconductor; and
forming a photosensitive member on a source electrode region, a drain electrode region and a channel forming region,
forming a source electrode and a drain electrode;
plasma-treating a portion of the extrinsic semiconductor between the source electrode and the drain electrode so as to form a protection member comprising at least one of a silicon oxide and a nitride material, respective sides of the protection member comprising ohmic contacts,
wherein the plasma treating a portion of the extrinsic semiconductor is performed while the photosensitive member remains on the source electrode and the drain electrode.

14. The manufacturing method of claim 13, further comprising etching the extrinsic semiconductor and the intrinsic semiconductor, and ashing the photosensitive member on the channel forming region, wherein the forming the data line, the etching the extrinsic semiconductor and the intrinsic semiconductor, the ashing the photosensitive member on the channel forming region and the plasma-treating a portion of the extrinsic semiconductor are performed in a same chamber.

15. A manufacturing method of a display panel, comprising:
forming a gate line including a gate electrode on a substrate;
forming a gate insulating layer on the gate electrode;
forming an intrinsic semiconductor on the gate insulating layer;
forming an extrinsic semiconductor on the intrinsic semiconductor;
forming a data line forming material on the extrinsic semiconductor;
forming a photosensitive pattern on a source electrode region, a drain electrode region and a channel forming region,
etching the data line forming material, the extrinsic semiconductor and the intrinsic semiconductor;
ashing the photosensitive pattern on the channel forming region;
etching the data line forming material on the channel forming region; and
plasma-treating a portion of the extrinsic semiconductor between the source electrode and the drain electrode so as to form a protection member comprising at least one of a silicon oxide and a nitride material, respective sides of the protection member comprising ohmic contacts,
wherein the forming a data line forming material, the etching the extrinsic semiconductor and the intrinsic semiconductor, the ashing the photosensitive member on the channel forming region and the plasma-treating a portion of the extrinsic semiconductor are performed in a same chamber.

* * * * *